United States Patent [19]

Hinton et al.

[11] Patent Number: 5,195,103
[45] Date of Patent: Mar. 16, 1993

[54] EXTERNALLY MODULATED LASER SOURCE FOR ARRAY ILLUMINATION

[75] Inventors: Harvard S. Hinton, Batavia; Rick L. Morrison, Naperville, both of Ill.

[73] Assignee: AT&T Bell Laboratories, Murray Hill, N.J.

[21] Appl. No.: 703,538

[22] Filed: May 21, 1991

[51] Int. Cl.[5] .................................. H01S 3/08
[52] U.S. Cl. ........................ 372/96; 372/26; 372/102
[58] Field of Search ............ 372/103, 102, 92, 96, 372/107, 108, 26

[56] References Cited

U.S. PATENT DOCUMENTS

| | | | |
|---|---|---|---|
| 4,656,641 | 4/1987 | Scifres et al. | 372/103 |
| 4,978,974 | 12/1990 | Etzel | 346/107 R |
| 5,050,179 | 9/1991 | Mooradian | 372/103 |

OTHER PUBLICATIONS

"Coherent beam addition of GaAlAs lasers . . . ", J. R. Leger et al., *Appl. Phys. Lett.*, vol. 48, No. 14, Apr. 1986, pp. 888-890.
"Coherent summation of laser beams . . . ", W. B. Veldkamp et al., *Optics Lett.*, vol. 11, No. 5, May 1986, pp. 303-305.
"Coherent laser addition . . . ", J. R. Leger et al., *Applied Optics*, vol. 26, No. 20, Oct. 1987, pp. 4391-4399.

*Primary Examiner*—Leon Scott, Jr.
*Attorney, Agent, or Firm*—W. W. Koba

[57] ABSTRACT

An arrangement for generating an array (one- or two-dimensional) of optical beams, or spots, is disclosed. The array is particularly useful in conjunction with an array of optically sensitive devices utilized in applications such as optical computing or photonic switching. The array generator includes an optical gain medium and a partially reflecting mirror disposed to form an externally modulated laser arrangement. A diffraction grating, such as a Dammann grating, is disposed in the signal path to form the required array of optical beams. A wavelength control element, including transparent and non-reflecting regions, may be disposed beyond the output of the diffraction grating to provide optical feedback for wavelength stabilization of the gain medium.

17 Claims, 3 Drawing Sheets

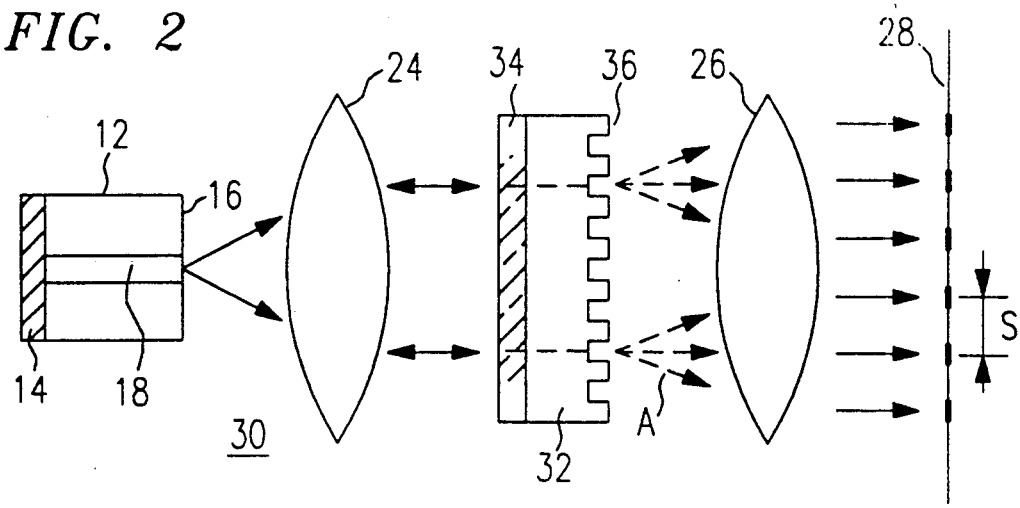
FIG. 2
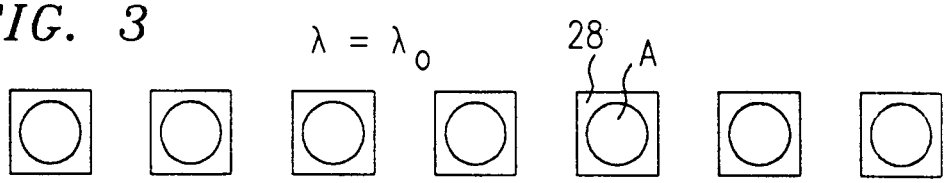
FIG. 3   $\lambda = \lambda_0$
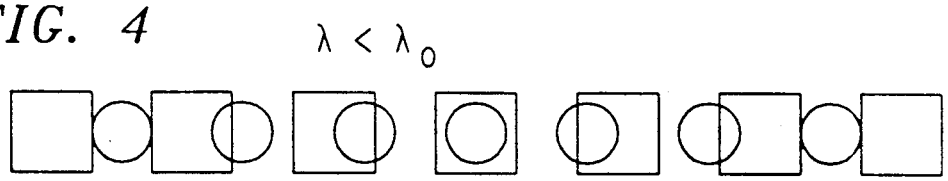
FIG. 4   $\lambda < \lambda_0$
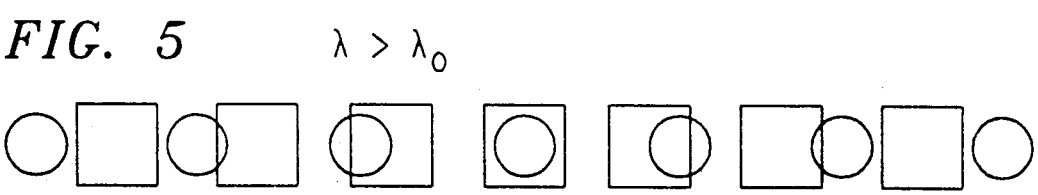
FIG. 5   $\lambda > \lambda_0$
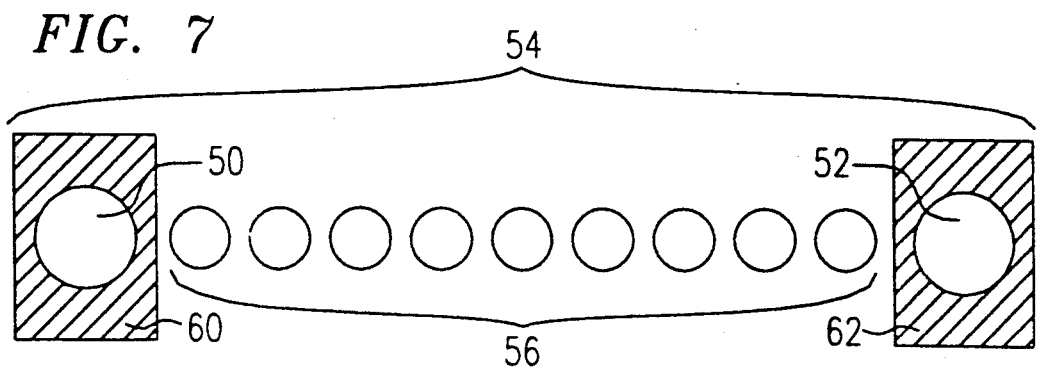
FIG. 7

EXTERNALLY MODULATED LASER SOURCE FOR ARRAY ILLUMINATION

BACKGROUND OF THE INVENTION

1. Technical Field

The present invention relates to an optical power source for array illumination and, more particularly, to an externally modulated laser configuration.

2. Description of the Prior Art

Many advanced photonic systems such as optical computing and free-space photonic switching are based upon arrays of symmetric self-electrooptic effect devices (S-SEEDs). In these systems, the S-SEEDs function as detectors, logic elements, or modulators. Each system relies on arrays of light beams (modulated by the S-SEED arrays) to transmit information between components of the system. One method for producing the required light beam array is discussed in an article entitled "Binary phase grating generating even numbered spot arrays" by R. L. Morrison et al. appearing in the 1989 Technical Digest of the Optical Society of America, Annual Meeting (Vol. 18). The Morrison et al. article describes the beam array generator as comprising a laser diode source and a spot array generator mechanism, such as a grating and appropriate lensing. In operation, a collimating lens is coupled to the output of the laser diode, followed by a grating for producing a diffraction pattern related to the size and periodicity of the grating, and a Fourier transform lens disposed a focal length above the plane associated with the location of the spot array at the output of the grating. The optical Fourier transform lens functions to change the wavelength-dependent diffraction pattern into a spatial array (one- or two-dimensional) of beams, or spots.

Unfortunately, the above-described array generator mechanism requires stringent tolerances on the laser wavelength, since the spatial displacement of the light spots is a function of wavelength. For example, if the wavelength is too short or too long, the spot spacing is either reduced or expanded, respectively, such that extreme spots are no longer aligned with the underlying photosensitive device (e.g., S-SEED, 1- or 2-dimensional opto-electronic integrated circuits, photodiodes, etc.). As array size grows, wavelength control becomes more critical. Additionally, the photo-sensitive area of a SEED is concentrated within each cell to improve its performance. Therefore, the beam array must not only be wavelength-controlled, but physically aligned within the photo-sensitive area of the receiving device.

As photonic-based systems increase in size and speed, the need for higher power sources grows accordingly. In particular, the operating speed of a digital system is determined by the energy required to switch the state of an individual logic device and the capacity of the power supply. One such digital system may comprise a photonic switch capable of handling over a thousand channels modulated at about 100 MHz (on each channel). Such a system may comprise several modules with at least one S-SEED devoted to each channel. Given a switching energy of approximately one pJ and an optical efficiency of about 10% (for relaying the light from the laser to the S-SEED array and then on to the next module), a laser of about 1000 mW power would be required for each module.

A need remains in the art, therefore, for a light source capable of generating a spot array which is stable with wavelength and provides sufficient power for photonic system applications.

SUMMARY OF THE INVENTION

The need remaining in the prior art is addressed by the present invention which relates to an optical power source and, more particularly, to an externally modulated laser configuration.

In accordance with an exemplary embodiment of the present invention, a spot array generator comprises an optical gain medium and a partially reflecting mirror (thus forming an externally modulated laser arrangement), with a diffraction grating disposed in the optical signal path of the partially reflecting mirror. For one arrangement, the grating may comprise a physically separate element disposed between the gain medium and the partially reflecting mirror. Alternatively, the grating and partially reflecting mirror may be combined into a single component.

Wavelength stability may be provided in accordance with the teachings of the present invention by utilizing a control element positioned beyond the output of the diffraction grating. The control element comprises an array of transparent regions (positioned to intercept the array of diffracted beams), with non-reflective (e.g., absorbing) material surrounding the transparent regions. If the wavelength of the gain medium drifts out of the desired range, the size of the beam array (i.e., separation between beams) will expand (wavelength increase) or contract (wavelength decrease). The wavelength shift results in increased energy being intercepted by the non-reflective material. The result is that insufficient optical power is coupled back into the gain medium to support stimulated emission. Therefore, optical wavelength stability is attained for the situation where the stimulated light matches the predetermined system wavelength.

Various other features and advantages of the present invention will become apparent during the course of the following discussion and by reference to the accompanying drawings.

BRIEF DESCRIPTION OF THE DRAWING

Referring now to the drawings,

FIG. 2 illustrates an alternative embodiment of the present invention where the diffraction grating and partially reflecting mirror are combined in to a single component;

FIGS. 3–5 illustrate the wavelength-dependent nature of the spacing between spots of a generated optical beam array;

FIG. 7 illustrates an exemplary altered-intensity spot beam array which may provide greater wavelength control selectivity in accordance with the teachings of the present invention.

DETAILED DESCRIPTION

To obtain high power (e.g., >100 mW) from semiconductor laser diodes, broad stripe and broad area devices have been used, due to their wide (e.g., >50 $\mu$m) current injection stripes which result in a large active volume. In addition, the wide stripe reduces the power per unit area on the laser facet, thereby increasing the total optical power which may impinge the facet before damage occurs. However, the stripe dimension also allows for multiple transverse modes to exist. To remedy this situation, a laser diode may be coupled to an external cavity which consists of a lens system and partially reflecting mirror. With proper coating of the diode facets, the external cavity arrangement is capable of providing filtering of the unwanted transverse modes.

Figure 1:
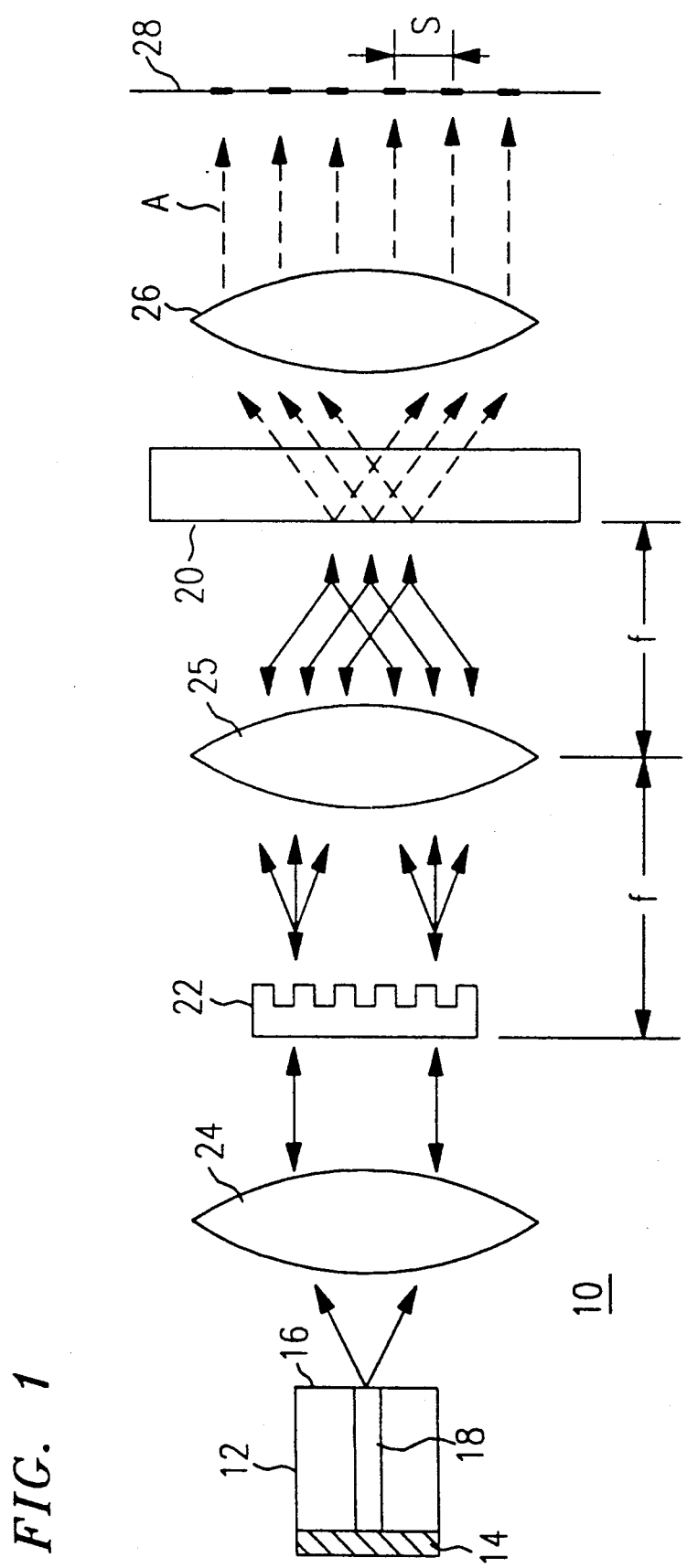
FIG. 1 illustrates an exemplary externally modulated spot array generator formed in accordance with the present invention.

In accordance with the teachings of the present invention, an external cavity laser may be configured to generate an array of beams, or spots, suitable as a light source for array applications such as, but not limited to, optical computing or photonic switching. FIG. 1 illustrates an exemplary spot array generator 10 of the present invention. Generator 10 comprises a semiconductor gain medium 12 including a reflective rear facet 14 and an anti-reflective (AR)-coated front facet 16. A relatively wide active stripe 18 is formed within medium 12 such that light is emitted in the indicated direction. It is to be understood that the drawing of FIG. 1 (as well as the following illustrations) is not to scale and, in fact, has been enlarged for the sake of explanation. Generator 10 further includes, at the output thereof, a partially reflecting mirror element 20 which is designed to allow a predetermined portion (e.g., 10%) of the light impinging its surface to pass therethrough. The remainder of the light energy is reflected back through generator 10 so as to re-enter gain medium 12. The combination of partially reflecting mirror 20 and reflective rear facet 14 thus form a cavity which is capable of supporting the desired laser mode.

In accordance with the teachings of the present invention, a diffraction grating (containing a predetermined pattern as will be discussed below) is utilized to generate the desired spot array pattern, where the pattern may either be one-dimensional (e.g., a single row or line of spots) or two-dimensional (e.g., a matrix of spots). Referring to FIG. 1, a diffraction grating 22 is illustrated as being disposed between gain medium 12 and partially reflecting mirror 20. Generator 10 further comprises a collimating lens 24 positioned between gain medium 12 and grating 22, and a second lens 25 disposed between grating 22 and partially reflecting element 20, where lens 25 is positioned a focal length f between elements 22 and 20. A final imaging lens 26 is positioned beyond partially reflecting mirror 20 and functions to image a collimated beam array onto an array of photosensitive devices 28.

Generator 10 is initiated by biasing gain medium 12 (not shown) such that an optical signal will be emitted from active region 18. This light from gain medium 12 is then collimated by lens 24 and the collimated beam impinges grating 22. Diffraction grating 22 is composed of a periodic replication of either a one- or two-dimensional pattern across the surface of a transparent substrate. The pattern's periodicity produces a regular spacing of grating orders, while the pattern itself determines the relative order intensities (i.e., the energy coupled into the various spots). The grating may be formed either by etching the substrate or depositing a material onto the substrate surface. A complete description of an exemplary diffraction grating, referred to in the art as a "Dammann grating", may be found in a article entitled "High-efficiency in-line multiple imaging by multiple phase holograms", by H. Dammann et al. appearing in *Optical Communications*, Vol. 3, 1971, pp. 312-315.

The array of diffracted beams formed by grating 22 subsequently passes through lens 25 which performs an optical Fourier transform so as to change the frequency-based array of beams into a spatially-based array of beams. The spatial array then impinges partially reflecting mirror element 20 where, as indicated by the dotted lines, a fraction of the energy passes therethrough unimpeded (e.g., 10%). The propagating spot beam array A is then collimated by imaging lens 26 and subsequently focused onto the array of optically-sensitive devices 28, such as the symmetric self-electrooptic effect devices (S-SEEDs) mentioned above. It is to be understood that the spot array generator of the present invention is suitable for use with virtually any array of photosensitive devices. The description of S-SEEDs throughout the course of the following discussion is considered to be exemplary only and not to preclude or limit the scope of the present invention. As indicated by the double arrows in FIG. 1, the remaining light energy reflected by mirror element 20 propagates back through the system and re-enters gain medium 12. Since the lenses and the diffraction grating are reciprocal elements, the various rays will converge at laser diode 12 so as to re-enter active region 18 and again be reflected by rear facet 14 to maintain the lasing action.

An alternative arrangement of the present invention where the grating and partially reflecting mirror are combined into a single element is illustrated in FIG. 2. As shown, generator 30 of FIG. 2 comprises a laser diode 12 essentially identical to that described above in association with FIG. 1. A similar lens 24 is utilizes to collimate the output beam from active region 18 of laser diode 12. The collimated beam next impinges reflective grating element 32, as shown in FIG. 2, which functions to reflect a portion (e.g., 80-90%) of the collimated beam and transmit the remainder. As shown in FIG. 2, element 32 comprises a partially reflecting surface 34 which redirects a portion of the collimated beam back through lens 24 and into device 12 to maintain the stimulated emission. The transmitted portion of the collimated beam is subsequently diffracted by a grating feature 36 formed on the opposing surface 38 of element 32. The generator array of beams A is subsequently collimated by imaging lens 26 and focused onto the optically sensitive array of devices 28, as with the arrangement of FIG. 1. Alternatively, the positions of reflecting surface 34 and grating feature 36 may be reversed so that the collimated beam from lens 24 is first diffracted and then reflected.

Regardless of the embodiment employed, a critical aspect of the invention is the ability to achieve alignment between the spot array A and the array of devices 28. In free-space optical logic system applications, the spot array is designed to contain a central region with orders of uniform intensities. It is highly desirable to couple a substantial fraction of the total intensity into these orders. The array can be composed of either an odd or even number of spots, where both types of arrays form regularly-spaced arrays of spots. However, the even-numbered spot array contains suppressed (or zero intensity) orders interlaced with the high intensity spots. An exemplary relatively simple grating which may be used in accordance with the present invention is the two-level, or binary phase grating (BPG). The binary phase grating creates a set of N spots in an odd-numbered array using a pattern with approximately N/2 phase transitions. The even-numbered design requires approximately twice as many transitions, since the suppressed orders require additional parameters in the design process. For even-numbered designs to achieve an equivalent spot spacing, the order spacing must be halved, leading to a doubling of the period. The binary phase grating is designed using optimization techniques that measure performance based on scalar diffraction theory and may be fabricated suing standard micro-lithography and etching procedures. An exemplary one-dimensional BPG has a diffractive efficiency (the fraction of energy coupled into the desired central orders) in the range of about 70–80% for moderately sized arrays. The remaining energy is dispersed into higher order spots. FIG. 3 illustrates an exemplary one-dimensional spot array A which is essentially aligned with an underlying array of optically sensitive devices 28. In the case where alignment is achieved, the wavelength $\lambda$ of the spot array generator is essentially identical to the calculated wavelength $\lambda_0$ required for the predetermined spacing S of devices 28, where $$S = 2\frac{(\lambda f)}{P},$$

for even-numbered designs, with f being defined as the focal length of lens 25 and P as the pitch of grating 22. For odd-numbered designs, the factor of two is dropped. This wavelength sensitivity becomes critically important in a large spot array since the overall size, which is the sum of all spot spacings, must match a fixed size photonic device array layout. It is often advantageous (and for even-numbered gratings, necessary) to design the grating such that light traversing the two separate regions differs by a phase shift of $\pi$. As a result of this requirement, any portion of a plane wave that experiences two separate $\pi$ phase shifts would behave equivalently to experiencing no phase shift. The $\pi$ shift allows for the combination of two orthogonally oriented independent solutions to from a two-dimensional structure and still maintain a binary level design.

Referring to FIG. 4, if the generator wavelength $\lambda$ is (or becomes) shorter than the calculated wavelength $\lambda_0$ required for the particular spot spacing S, spot array A will become misaligned with devices 28 in the manner illustrated in the drawing. In contrast, FIG. 5 illustrates the situation where the wavelength $\lambda$ of the generator is (or becomes) longer than the desired system wavelength $\lambda_0$. In either case, it is clear that if the generator wavelength is allowed to drift too far from the desired value $\lambda_0$, insufficient light energy will be coupled into the optically sensitive devices. The ability to control the wavelength of such an array generator, therefore, is critical to the performance of the system.

Figure 6:
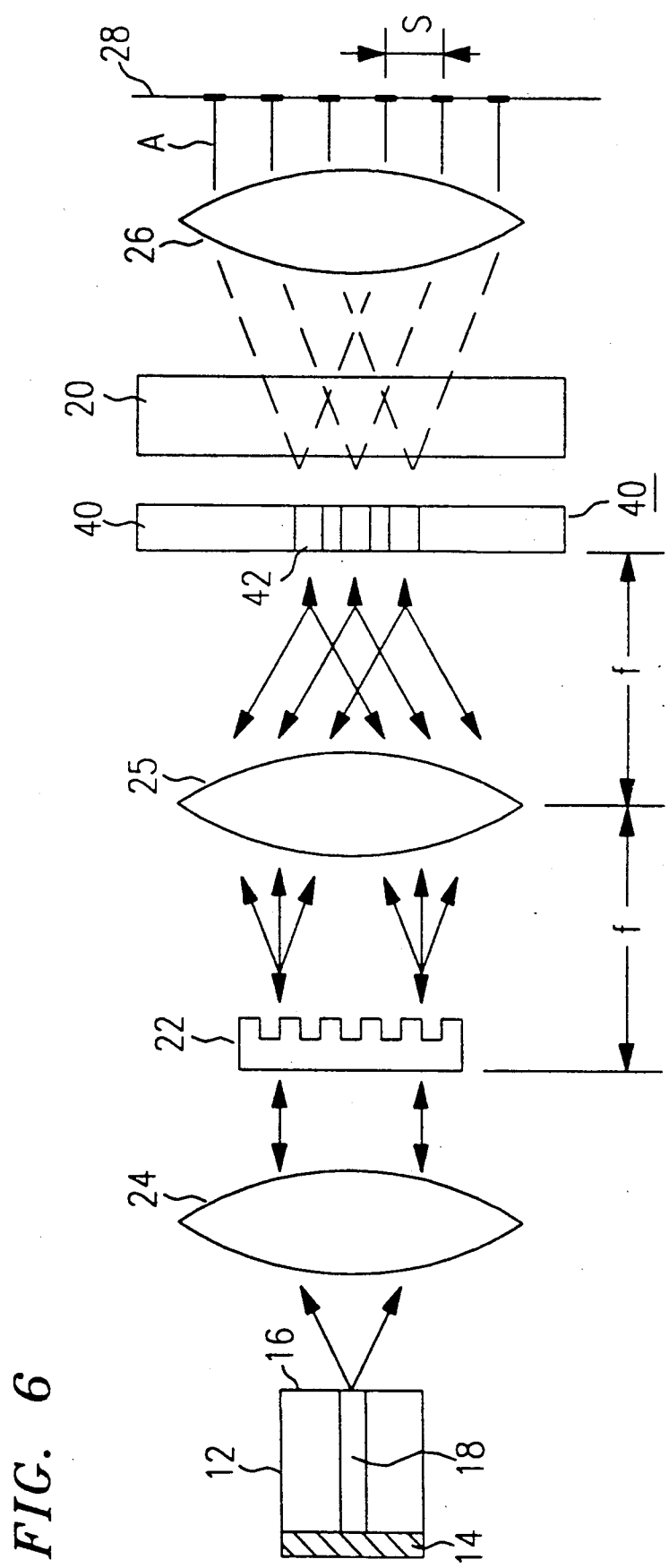
FIG. 6 illustrates an exemplary arrangement of the present invention including a wavelength control element for providing stability of the signal generated by the optical gain medium.

The movement of the spots as a function of wavelength variation can be utilized in accordance with the teachings of the present invention to produce a passive wavelength control arrangement. FIG. 6 illustrates an exemplary arrangement of the present invention (similar to that discussed above in association with FIG. 1) including a wavelength control element 40 which may be used in accordance with the teachings of the present invention to provide passive wavelength control. As shown, element 40 comprises a plurality of transparent regions 42 and a non-reflective (e.g., absorbing or attenuating) region 44 formed to surround the plurality of transparent regions 42. Referring to FIG. 6, transparent regions 42 are disposed so as to align with the various beams forming the spot array generated by diffracting element 22 when the generator wavelength $\lambda$ is essentially equal to the predetermined value $\lambda_0$ required for the predetermined spot spacing S. Assuming the system wavelength is at the desired value, therefore, the diffracted array formed by grating 22 will pass through transparent regions 42 unimpeded and enter partially reflecting element 20. As the wavelength begins to drift (in either direction), however, the spot array will physically shift (as illustrated in FIGS. 4 and 5) such that a significant portion of the optical energy will impinge non-reflective region 44 of element 40. The attenuation (i.e., non-reflection) of the signal power within region 44, therefore, results in a decreasing amount of energy being returned to gain medium 12 such that stimulated emission cannot be maintained. An optical power monitor can be used, therefore, to modify the laser bias current in response to the drop in reflected power so as to stabilize the wavelength of the generator.

Although the above arrangement is suitable for most applications, there may exist systems which require an enhanced wavelength sensitivity. For example, in extremely large arrays (i.e., hundreds of elements), the outermost beam spots and associated optically sensitive elements may become misaligned long before any noticeable change in reflected signal power is achieved, since these elements account for only a fraction of the total signal intensity. Thus, an alternative wavelength control arrangement may be utilized in this case. In particular, a diffraction grating may be modified so that an increased signal intensity is directed to the outermost spots, with a highly reflective mirror (perhaps 95–100% instead of 80%) used to return the beams back through the generator. FIG. 7 illustrates an altered spot array suitable for this purpose where the diffraction grating has been altered such that spots 50,52 of a beam array 54 are generated to provide an increased intensity over the internal spots 56. Highly reflective mirror elements 60,62 are illustrated as aligned with spots 50 and 52, respectively, so as to couple an increased percentage of their energy back into the generator. Therefore, wavelength drift resulting in misalignment of spots 50,52 (shown in phantom in FIG. 7) will be detectable with the illustrated altered beam pattern. In fact, spots 50,52 may be used solely for wavelength control purposes. In this case, spots 50,52 would not be associated with any underlying optically sensitive devices and approximately 100% of the impinging optical signal would be reflected back into the spot array generator.

We claim:

1. An optical source comprising
a semiconductor optical gain medium including a reflective rear facet and a transmissive front facet for generating a coherent optical signal;
a partially reflecting mirror element aligned with the transmissive front facet of said optical gain medium and physically separated therefrom to form an externally modulated laser which includes an optical cavity;
a diffraction grating transversely disposed to receive the optical signal from the transmissive front facet of said gain medium and optically aligned with the partially reflecting mirror so as to form a plurality of diffracted optical beams as an output of the optical source;
first collimating lensing means disposed between the optical gain medium and the diffraction grating for collimating the coherent optical signal generated by said gain medium;

Fourier transform lensing means disposed between the diffraction grating and the partially reflecting mirror for providing optical signal coupling therebetween; and second collimating lensing means disposed beyond the partially reflecting mirror element for collimating the optical signal generated by said partially reflecting mirror element.

2. An optical source as defined in claim 1 wherein the partially reflecting mirror and the diffraction grating comprise physically separate elements.

3. An optical source as defined in claim 1 wherein the diffraction grating is combined with the partially reflecting mirror element.

4. An optical source as defined in claim 3 wherein the partially reflecting mirror is formed on the surface of the combined element nearest the first collimating lensing means and the diffraction grating is formed on the opposing surface of said combined element.

5. An optical source as defined in claim 3 wherein the diffraction grating is formed on the surface of the combined element nearest the first collimating lensing means and the partially reflecting mirror is formed on the opposing surface of said combined element.

6. An optical source as defined in claim 1 wherein the source further comprises a wavelength control means for recognizing when a source wavelength $\lambda$ has drifted beyond a predetermined value $\lambda_0$, said wavelength control means comprising a control element disposed beyond the output of the diffraction grating including a plurality of transparent regions aligned with the position of the plurality of diffracted optical beams when $\lambda$ is essentially equal to $\lambda_0$; and optically non-reflective means surrounding said plurality of transparent regions for intercepting a portion of the plurality of diffracted optical beams when $\lambda$ sufficiently deviates from the predetermined value $\lambda_0$.

7. An optical source as defined in claim 6 wherein the optically non-reflective means comprises optical absorbing means.

8. An optical source as defined in claim 6 wherein the optically non-reflective means comprises optical transparent means.

9. An optical source as defined in claim 6 wherein the optically non-reflective means comprises optical attenuating means.

10. An optical source as defined in claim 6 wherein the wavelength control means is formed as a layer disposed over a surface of the partially reflecting mirror element.

11. In a photonic switching system utilizing an array of photosensitive devices to control switching between logic states of an associate array of logic elements, the photonic switching system comprises means for generating an array of optical beams, said optical beams associated with said array of photosensitive devices in an one-to-one relationship such that each optical beam impinges a separate photosensitive device, the generator means comprising a semiconductor optical gain medium including a reflective rear facet and a transmissive front facet, the front facet including a relatively wide active region for generating a coherent optical signal;

a partially reflecting mirror aligned with the transmissive front facet of said optical gain medium and physically separated therefrom to form an externally modulated laser which includes an optical cavity;

a diffraction grating transversely disposed to receive the optical signal from the gain medium and optically aligned with the partially reflecting mirror element to form the array of optical beams as an output of the generator means.

12. In a photonic switching system as defined by claim 11, the diffraction grating comprising a phase grating capable of forming an array of laser spot beams aligned with and matched in dimensions to an array of self-electrooptic effect devices.

13. In a photonic switching system as defined by claim 11, the diffraction grating configured to produce relatively high intensity spot beams at a first location within the array when compared with the intensity of spot beams at a second location within said array.

14. In a photonic switching system as defined by claim 11, the diffraction grating comprises a Dammann grating.

15. In a photonic switching system as defined by claim 11, the array of photosensitive devices comprises an array of self-electrooptic effect devices (SEEDs).

16. In a photonic switching system as defined in claim 11, the generating means further comprising wavelength control means for maintaining alignment between the array of photosensitive devices and the array of optical beams, the wavelength control means comprising a control element disposed at the output of the diffraction grating including a plurality of transparent regions for passing the array of optical beams when a generator wavelength $\lambda$ is essentially equal to a predetermined wavelength $\lambda_0$ associated with a predetermined spacing of the array of photosensitive devices; and optically non-reflective means surrounding the plurality of transparent regions for intercepting portions of the array of optical beams when the generator wavelength $\lambda$ shifts away from the predetermined value $\lambda_0$.

17. In a photonic switching system as defined in claim 16, the wavelength control means being disposed as a layer over the surface of the partially reflecting mirror element.

* * * * *